United States Patent
Koike et al.

(10) Patent No.: US 10,020,203 B1
(45) Date of Patent: Jul. 10, 2018

(54) EPITAXIAL SILICON WAFER

(71) Applicant: SUMCO CORPORATION, Tokyo (JP)

(72) Inventors: Yasuo Koike, Tokyo (JP); Tomokazu Katano, Tokyo (JP); Toshiaki Ono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/399,981

(22) Filed: Jan. 6, 2017

(51) Int. Cl.
| | |
|---|---|
| *H01L 23/58* | (2006.01) |
| *H01L 21/322* | (2006.01) |
| *H01L 29/16* | (2006.01) |
| *H01L 29/32* | (2006.01) |
| *H01L 29/36* | (2006.01) |
| *H01L 21/02* | (2006.01) |
| *C30B 29/06* | (2006.01) |
| *C30B 29/64* | (2006.01) |
| *C30B 15/20* | (2006.01) |

(52) U.S. Cl.
CPC ........ *H01L 21/3225* (2013.01); *C30B 15/206* (2013.01); *C30B 29/06* (2013.01); *C30B 29/64* (2013.01); *H01L 21/02532* (2013.01); *H01L 21/02584* (2013.01); *H01L 29/16* (2013.01); *H01L 29/32* (2013.01); *H01L 29/365* (2013.01)

(58) Field of Classification Search
CPC ..... C30B 33/02; C30B 23/025; C30B 25/186; C30B 29/06; H01L 21/3225; H01L 21/67115; H01L 21/68735; H01L 29/16; H01L 29/167; H01L 29/36
See application file for complete search history.

(56) References Cited

U.S. PATENT DOCUMENTS

| | | | |
|---|---|---|---|
| 2004/0194692 A1* | 10/2004 | Nishikawa | C30B 29/06 117/84 |
| 2007/0252239 A1* | 11/2007 | Maeda | H01L 21/3225 257/607 |

(Continued)

FOREIGN PATENT DOCUMENTS

| | | |
|---|---|---|
| JP | 2003-073191 A | 3/2003 |
| WO | 01/34882 A1 | 5/2001 |
| WO | WO 2014/162373 | * 10/2014 |

*Primary Examiner* — A. Sefer

(74) *Attorney, Agent, or Firm* — Greenblum & Bernstein, P.L.C.

(57) ABSTRACT

An epitaxial silicon wafer includes a silicon wafer consisting of a COP region in which a nitrogen concentration is $1 \times 10^{12} - 1 \times 10^{13}$ atoms/cm$^3$, and an epitaxial silicon film formed on the silicon wafer. When heat treatment for evaluation is applied, a density of BMD formed inside the silicon wafer is $1 \times 10^8 - 3 \times 10^9$ atoms/cm$^3$ over the entire radial direction of the silicon wafer. An average density of the BMD formed in an outer peripheral region of the silicon wafer which is a 1-10 mm range separated inward from an outermost periphery thereof is lower than the average density of the BMD formed in a center region. A variation in the BMD density in the outer peripheral region is 3 or less, and a residual oxygen concentration in the outer peripheral region is $8 \times 10^{17}$ atoms/cm$^3$ or more.

7 Claims, 9 Drawing Sheets

(56) References Cited

U.S. PATENT DOCUMENTS

| | | | | |
|---|---|---|---|---|
| 2008/0108207 A1* | 5/2008 | Koike | ............... | C30B 29/06 |
| | | | | 438/502 |
| 2009/0261299 A1* | 10/2009 | Watanabe | ............ | C30B 25/20 |
| | | | | 252/500 |
| 2012/0043644 A1* | 2/2012 | Ono | ............. | C30B 29/06 |
| | | | | 257/607 |
| 2014/0044945 A1* | 2/2014 | Mueller | ............ | C30B 15/14 |
| | | | | 428/216 |
| 2016/0032491 A1* | 2/2016 | Lu | ............. | C30B 15/203 |
| | | | | 428/357 |
| 2016/0042974 A1* | 2/2016 | Ono | ............ | H01L 21/3225 |
| | | | | 257/617 |

\* cited by examiner

| | Nitrogen concentration (atoms/cm³) | Oxygen concentration (× 10¹⁵ atoms/cm³) | Presence/absence of pre-annealing | BMD density in wafer center (/cm³) | Variation of BMD density in wafer outer peripheral region (Max-Min)/Ave) | Minimum residual oxygen concentration (×10¹⁷atoms/cm³) | Slip resistance | Gettering capability |
|---|---|---|---|---|---|---|---|---|
| Example 1 | 1.0E+12 | 8.5 | present | 2.70E+08 | 2.3 | 8.1 | ○ | ○ |
| Example 2 | 2.5E+12 | 12.3 | present | 4.60E+08 | 2.1 | 11.6 | ○ | ○ |
| Example 3 | 5.1E+12 | 9 | present | 3.50E+08 | 1.6 | 8.8 | ○ | ○ |
| Example 4 | 5.2E+12 | 12.9 | present | 7.20E+08 | 1.8 | 10.6 | ○ | ○ |
| Example 5 | 9.0E+12 | 8.2 | present | 5.50E+08 | 1.4 | 8.1 | ○ | ○ |
| Example 6 | 1.0E+13 | 12.4 | present | 1.80E+09 | 0.8 | 8.7 | ○ | ○ |
| Comparative Example 1 | 5.2E+12 | 12.9 | absent | <1E-07 | - | 12.8 | ○ | × |
| Comparative Example 2 | 5.1E+13 | 12.5 | absent | 1.30E+08 | 3.8 | 7.8 | × | ○ |
| Comparative Example 3 | 1.1E+14 | 12.3 | absent | 8.20E+08 | 3.7 | 7.5 | × | ○ |
| Comparative Example 4 | 5.1E+13 | 12.5 | present | 4.20E+09 | 2.8 | 7.7 | × | ○ |
| Comparative Example 5 | 1.1E+14 | 12.3 | present | 2.30E+10 | 2.5 | 6.3 | × | ○ |

FIG.7

| Distance from wafer center (mm) | 140 | 141 | 142 | 143 | 144 | 145 | 146 | 147 | 148 | 149 |
|---|---|---|---|---|---|---|---|---|---|---|
| Example 4 | 6.8E+08 (Max) | 6.5E+08 | 5.7E+08 | 6.4E+08 | 6.1E+08 | 5.2E+08 | 4.3E+08 | 4.5E+08 | 3.8E+08 | 3.8E+08 (Min) |
| Comparative Example 2 | 5.5E+08 (Min) | 5.9E+08 | 5.6E+08 | 5.5E+08 | 6.2E+08 | 7.4E+08 | 8.8E+08 | 9.2E+08 | 2.1E+09 | 3.2E+09 (Max) |
| Comparative Example 4 | 3.7E+09 | 3.9E+09 (Max) | 2.7E+09 | 3.2E+09 | 2.3E+09 | 2.7E+09 | 2.2E+09 | 2.7E+09 | 1.4E+09 (Min) | 4.1E+09 |

BMD density (/cm³)

FIG.8

| | Nitrogen concentration (atoms/cm³) | Si single crystal diameter ratio | Maximum value of OSF density (cm⁻²) | BMD density at wafer center (cm⁻³) | BMD density in wafer outer periphery (cm⁻³) | Variation of BMD density in wafer outer peripheral region ((Max-Min)/Ave) | Slip resistance | Epitaxial defect |
|---|---|---|---|---|---|---|---|---|
| Example 1 | 1.0E+12 | 1.02 | - | 2.9E+08 | 2.8E+8 | 2.5 | ○ | ○ |
| Example 2 | 6.2E+12 | 1.02 | 62 | 7.5E+08 | 6.2E+8 | 2.2 | ○ | ○ |
| Example 3 | 1.0E+13 | 1.02 | 81 | 1.9E+09 | 8.3E+8 | 1.1 | ○ | ○ |
| Example 4 | 1.0E+12 | 1.05 | - | 2.8E+08 | 2.2E+8 | 2.1 | ○ | ○ |
| Example 5 | 6.2E+12 | 1.05 | 51 | 7.2E+08 | 5.7E+8 | 1.8 | ○ | ○ |
| Example 6 | 1.0E+13 | 1.05 | 31 | 1.7E+09 | 8.1E+8 | 0.8 | ○ | ○ |
| Example 7 | 1.0E+12 | 1.07 | - | 2.7E+08 | 2.1E+8 | 1.9 | ○ | ○ |
| Example 8 | 6.2E+12 | 1.07 | - | 7.7E+08 | 6.4E+8 | 1.6 | ○ | ○ |
| Example 9 | 1.0E+13 | 1.07 | 11 | 1.6E+09 | 8.3E+8 | 0.7 | ○ | ○ |
| Comparative Example 1 | 1.0E+12 | 1.01 | 109 | 2.9E+08 | 2.1E+8 | 2.7 | ○ | × |
| Comparative Example 2 | 6.2E+12 | 1.01 | 157 | 7.5E+08 | 5.8E+8 | 2.4 | ○ | × |
| Comparative Example 3 | 1.0E+13 | 1.01 | 163 | 1.7E+09 | 8.3E+8 | 1.4 | ○ | × |
| Comparative Example 4 | 1.9E+13 | 1.05 | 56 | 2.3E+09 | 4.1E+9 | 3.2 | × | × |
| Comparative Example 5 | 4.0E+13 | 1.05 | 231 | 4.1E+09 | 5.8E+9 | 3.7 | × | × |
| Comparative Example 6 | 9.5E+13 | 1.05 | 336 | 4.6E+9 | 5.9E+9 | 3.9 | × | × |
| Comparative Example 7 | 1.9E+13 | 1.08 | 24 | 2.8E+09 | 3.2E+9 | 2.7 | × | ○ |
| Comparative Example 8 | 4.0E+13 | 1.08 | 51 | 3.4E+09 | 3.8E+9 | 2.5 | × | ○ |
| Comparative Example 9 | 9.5E+13 | 1.08 | 73 | 4.7E+9 | 5.2E+9 | 2.2 | × | ○ |

FIG.9

EPITAXIAL SILICON WAFER

BACKGROUND OF THE INVENTION

Field of the Invention

The present invention relates to an epitaxial silicon wafer and, more particularly, to an epitaxial silicon wafer whose gettering capability is enhanced by nitrogen doping.

Description of Related Art

An epitaxial silicon wafer is widely used as a substrate material of semiconductor devices. The epitaxial silicon wafer is obtained by forming a silicon epitaxial film on a silicon wafer and has high crystal integrity.

When heavy metal impurities exist in an epitaxial silicon wafer used for a semiconductor device, the characteristics of the semiconductor device may be degraded, so that it is necessary to reduce the heavy metal impurities as much as possible. As one of the techniques for reducing the heavy metal impurities, various gettering techniques are known. The gettering technologies include, for example, a method called "intrinsic gettering (IG)". With this method, an oxygen precipitate (BMD: Bulk Micro Defect) is formed in a silicon wafer, and heavy metal impurities are trapped in the BMD. In recent years, there is a need to provide an epitaxial silicon wafer in which the density of the BMD formed in the wafer is $1 \times 10^8/cm^3$ or more.

In an epitaxial film formation process, a silicon wafer is heated at a high temperature of 1000° C. to 1200° C. At this time, minute oxygen-precipitation nuclei in the wafer are reduced or eliminated by high-temperature heat treatment, and the BMD cannot be sufficiently induced in the subsequent device process. Further, the lowering of device process temperature is promoted along with miniaturization of a semiconductor device to make it difficult for the oxygen-precipitation nuclei to grow during the device process, resulting in a noticeable reduction in the BMD density. This lowers the gettering capability of the epitaxial silicon wafer.

On the other hand, a method using a silicon wafer doped with nitrogen is known as a method to enhance the gettering capability of the epitaxial silicon wafer. In the silicon wafer doped with nitrogen, a thermally stable BMD hard to be eliminated even undergoing high-temperature heat treatment in an epitaxial process is formed in a crystal growth stage of a single crystal ingot, so that the gettering capability can be enhanced.

For example, Japanese Patent No. 3,760,889 describes a production method for an epitaxial silicon wafer including subjecting a silicon wafer doped with nitrogen to heat treatment (pre-annealing) at 700° C. to 900° C. for 15 minutes to four hours before epitaxial growth treatment. With this method, an epitaxial silicon wafer having a BMD density of $3 \times 10^4/cm^2$ or more can be produced irrespective of a position at which the silicon wafer is cut off from a single crystal ingot. Further, Japanese Patent No. 4,061,906 describes a method that forms the outer peripheral portion of a silicon wafer as an OSF (Oxidation induced Stacking Fault) region in order to suppress the growth of slip dislocation in the wafer outer peripheral portion that contacts a C ring of a vertical boat.

It is effective to increase the density of the BMD formed in the silicon wafer in order to enhance the gettering capability; on the other hand, however, oxygen in the silicon wafer is consumed for BMD formation to reduce a residual oxygen concentration in the wafer. The reduction in the residual oxygen concentration in the wafer causes a reduction in wafer strength. Particularly, when an oxygen concentration in the wafer outer peripheral portion is low, the outer peripheral portion becomes easy to flaw due to contact with a heat treatment boat during heat treatment, causing slip dislocation in the wafer outer peripheral portion with the flaw as a starting point.

According to the method described in Japanese Patent No. 3,760,889, the BMD density in the wafer is increased through heat treatment applied before epitaxial growth treatment, whereby an epitaxial silicon wafer excellent in the gettering capability can be obtained. However, the method does not consider a BMD density distribution in a wafer surface, that is, the BMD density in the wafer outer peripheral portion is excessively high, so that a residual oxygen concentration in the outer peripheral region is reduced, resulting in easy occurrence of the slip dislocation in the wafer outer peripheral portion.

The method described in Japanese Patent No. 4,061,906 aims at suppressing occurrence of the slip dislocation by forming the wafer outer peripheral portion as a ring-shaped OSF region (hereinafter, referred to as "R-OSF region"). However, when an epitaxial film is grown on the R-OSF region, a defect (epitaxial defect) may occur in the epitaxial film. Further, when a nitrogen concentration is high, the width of the R-OSF region formed in a crystal growth stage is increased and, accordingly, a region where the epitaxial defect occurs may be enlarged.

SUMMARY OF THE INVENTION

The present inventors have conducted extensive studies aiming at preventing occurrence of the slip dislocation in the wafer outer peripheral portion, and consequently found that application of pre-annealing to a silicon wafer having a low nitrogen concentration resulted in formation of a region having a low BMD density in a crystal oriented particle (COP) region on the side that contacts the R-OSF region and considered that a crystal region having the low density region is intentionally positioned in the outer peripheral portion to complete the present invention.

The object of the present invention is to provide an epitaxial silicon wafer capable of preventing occurrence of the slip dislocation by enhancing strength of the wafer outer peripheral portion while ensuring required gettering capability.

To solve the above problems, an epitaxial silicon wafer of the present invention is provided with a silicon wafer consisting of a COP region in which a nitrogen concentration is adjusted in a range of $1 \times 10^{12}$ atoms/cm$^3$ or more and $1 \times 10^{13}$ atoms/cm$^3$ or less, and an epitaxial silicon film formed on a surface of the silicon wafer, wherein When heat treatment for evaluating oxygen precipitates is applied to the epitaxial silicon wafer, a density of oxygen precipitates formed inside the silicon wafer is $1 \times 10^8$ atoms/cm$^3$ or more and $3 \times 10^9$ atoms/cm$^3$ or less over the entire radial direction of the silicon wafer, an average density of the oxygen precipitates formed in an outer peripheral region of the silicon wafer which is a 1-10 mm range separated inward from an outermost periphery thereof is lower than an average density of the oxygen precipitates formed in an center region of the silicon wafer which is the region other than the outer peripheral region, a value ((Max−Min)/Ave) obtained by dividing a difference between a maximum value (Max) and a minimum value (Min) of the density of the oxygen precipitates in the outer peripheral region by an average value (Ave) of the density of the oxygen precipitates in the outer peripheral region is 3 or less, and a residual oxygen concentration in the outer peripheral region is $8\times10^{17}$ atoms/cm³ (Old-ASTM_F121, 1979) or more.

According to the present invention, it is possible to suppress a reduction in the residual oxygen concentration in the wafer outer peripheral region while ensuring a desired BMD density in the wafer center region. Thus, it is possible to prevent occurrence of slip dislocation in the outer peripheral region while ensuring desired gettering capability, whereby an epitaxial silicon wafer with high quality and reliability can be provided.

In the epitaxial silicon wafer according to the present invention, it is preferable that the maximum value (Max) of the density of the oxygen precipitates exists in 6 mm to 10 mm range of the outer peripheral region, separated inward from the outermost periphery, and the minimum value (Min) of the density of the oxygen precipitates exists in a 0-less than 6 mm range of the outer peripheral region, separated inward from the outermost periphery. In this case, the density of the oxygen precipitates in the outer peripheral region is preferably gradually reduced toward the outermost periphery of the silicon wafer. With this configuration, it is possible to increase the BMD density in the wafer center region and to increase the residual oxygen concentration in the outer peripheral region, whereby both gettering capability and wafer strength can be made compatible.

In the epitaxial silicon wafer according to the present invention, when heat treatment for evaluating oxidation-induced stacking fault is applied, the density of oxidation-induced stacking fault observed on the back surface of the epitaxial silicon wafer is preferably 100/cm² or less. With this configuration, the entire wafer surface consists of a COP region, that is, the oxidation-induced stacking fault hardly exists, thereby suppressing occurrence of an epitaxial defect. Further, the oxidation-induced stacking fault hardly exists in the wafer outer peripheral region, so that it is possible to prevent an increase in the BMD density and a reduction in the residual oxygen concentration in the outer peripheral region. Thus, occurrence of slip dislocation in the wafer outer peripheral region can be prevented.

In the present invention, the silicon wafer is preferably cut out from a silicon single crystal ingot whose oxygen concentration is adjusted in a range of $8\times10^{17}$ atoms/cm³ (Old-ASTM_F121, 1979) or more and $14\times10^{17}$ atoms/cm³ (Old-ASTM_F121, 1979) or less. With this configuration, it is possible to prevent a reduction in the residual oxygen concentration in the outer peripheral region while ensuring a desired BMD density in the wafer center region.

In the present invention, a diameter of the epitaxial silicon wafer is preferably 300 mm or more. In this case, the silicon wafer is preferably cut out from a straight body section of a silicon single crystal ingot having a diameter 1.02 to 1.07 times larger than a target diameter and processed into the target diameter. Further, an outer periphery grinding region of the straight body section of the silicon single crystal ingot outside the target diameter preferably consists of an R-OSF region. As described above, by setting the diameter of the straight body section of the silicon single crystal ingot to a diameter 1.02 to 1.07 times the target diameter of the silicon wafer and positioning the R-OSF region in the silicon single crystal within the outer periphery grinding region for removal, it is possible to prevent the R-OSF region from being included in the silicon wafer and to position a region existing in the vicinity of a boundary with the R-OSF region, where the BMD density is reduced, in the wafer outer peripheral region. Thus, a region where the residual oxygen concentration is increased with a reduction in the BMD density can be positioned in the outer peripheral region, whereby the strength of the wafer can be enhanced.

According to the present invention, it is possible to provide an epitaxial silicon wafer capable of preventing occurrence of the slip dislocation by enhancing the strength of the wafer outer peripheral portion while ensuring required gettering capability.

BRIEF DESCRIPTION OF THE DRAWINGS

The above features and advantages of the present invention will be more apparent from the following description of certain preferred embodiments taken in conjunction with the accompanying drawings, in which:

FIG. 7 is a table showing results of the evaluation of the characteristics of the epitaxial silicon wafers with nitrogen concentration, oxygen concentration, and presence/absence of pre-annealing as parameters;

FIG. 8 is a table showing results of the BMD density distributions in the wafer outer peripheral region of Example 4 and Comparative Examples 2 and 4; and FIG. 9 is a table showing results of the evaluation of the characteristics of the epitaxial silicon wafers produced using a plurality of silicon single crystals having different nitrogen concentrations and diameters.

DETAILED DESCRIPTION OF THE EMBODIMENTS

Preferred embodiments of the present invention will be described hereinafter in detail with reference to the accompanying drawings.

Figure 1:
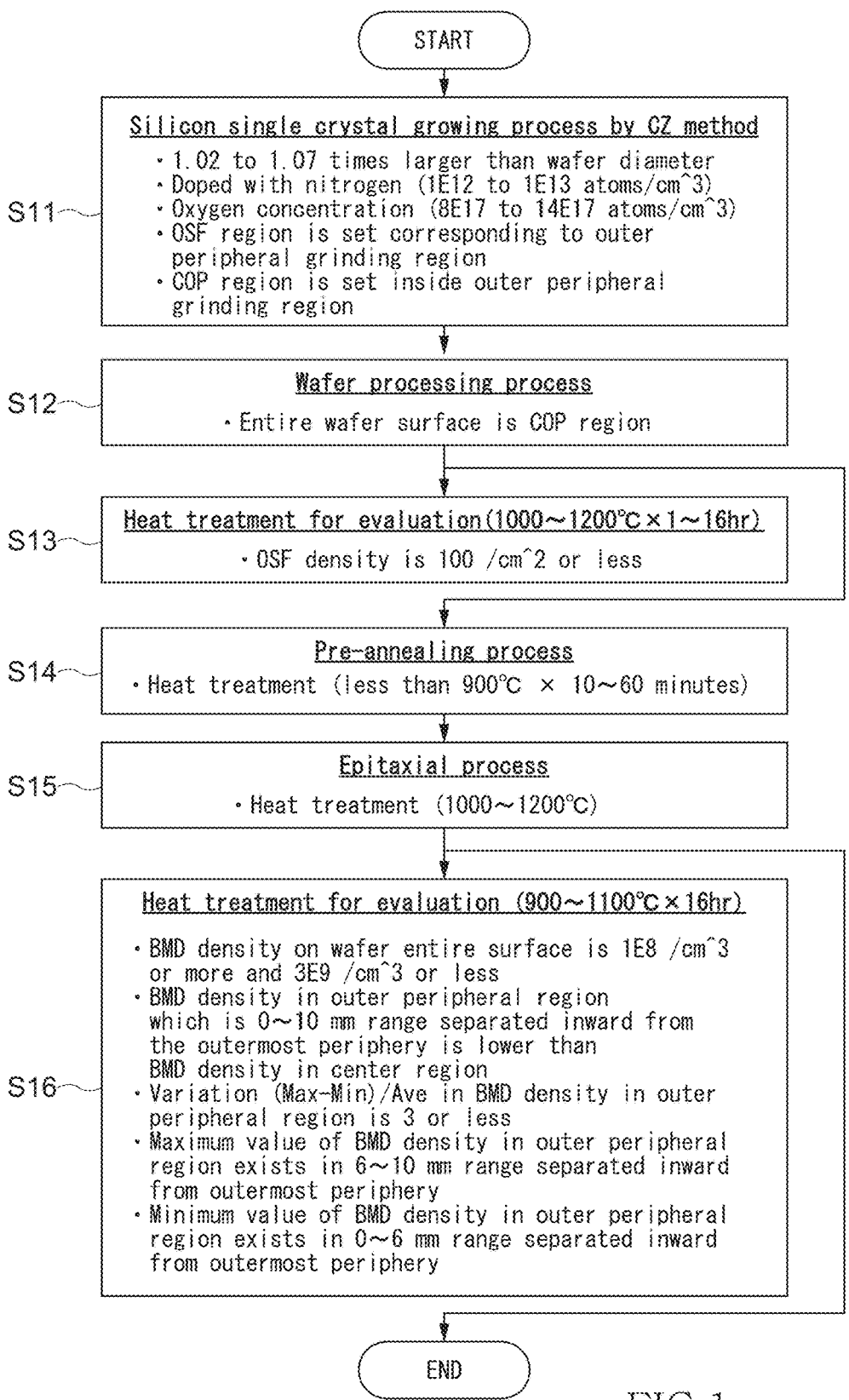
FIG. 1 is a flowchart for explaining a manufacturing method for an epitaxial silicon wafer according to an embodiment of the present invention.

FIG. 1 is a flowchart for explaining a manufacturing method for an epitaxial silicon wafer according to an embodiment of the present invention.

As illustrated in FIG. 1, in the epitaxial silicon wafer manufacturing method, a silicon single crystal growing process is performed using the Czochralski method (CZ method) (step S11). In the CZ method, a seed crystal is dipped into the liquid surface of a silicon melt contained in a quartz crucible and then pulled upward while being rotated, whereby a silicon single crystal having the same crystal orientation as the seed crystal is grown. Specifically, the following processes are sequentially performed: a liquid dipping process in which the seed crystal is dipped into the silicon melt; a necking process in which the crystal diameter is reduced by a so-called Dash-Neck method; a shoulder section growing process in which a single crystal diameter is gradually increased to a desired value; a body section growing process in which growing of the single crystal is continued with the crystal diameter kept substantially constant; and a tail section growing process in which the single crystal is separated from the silicon melt while the diameter thereof is gradually reduced.

Figure 2:
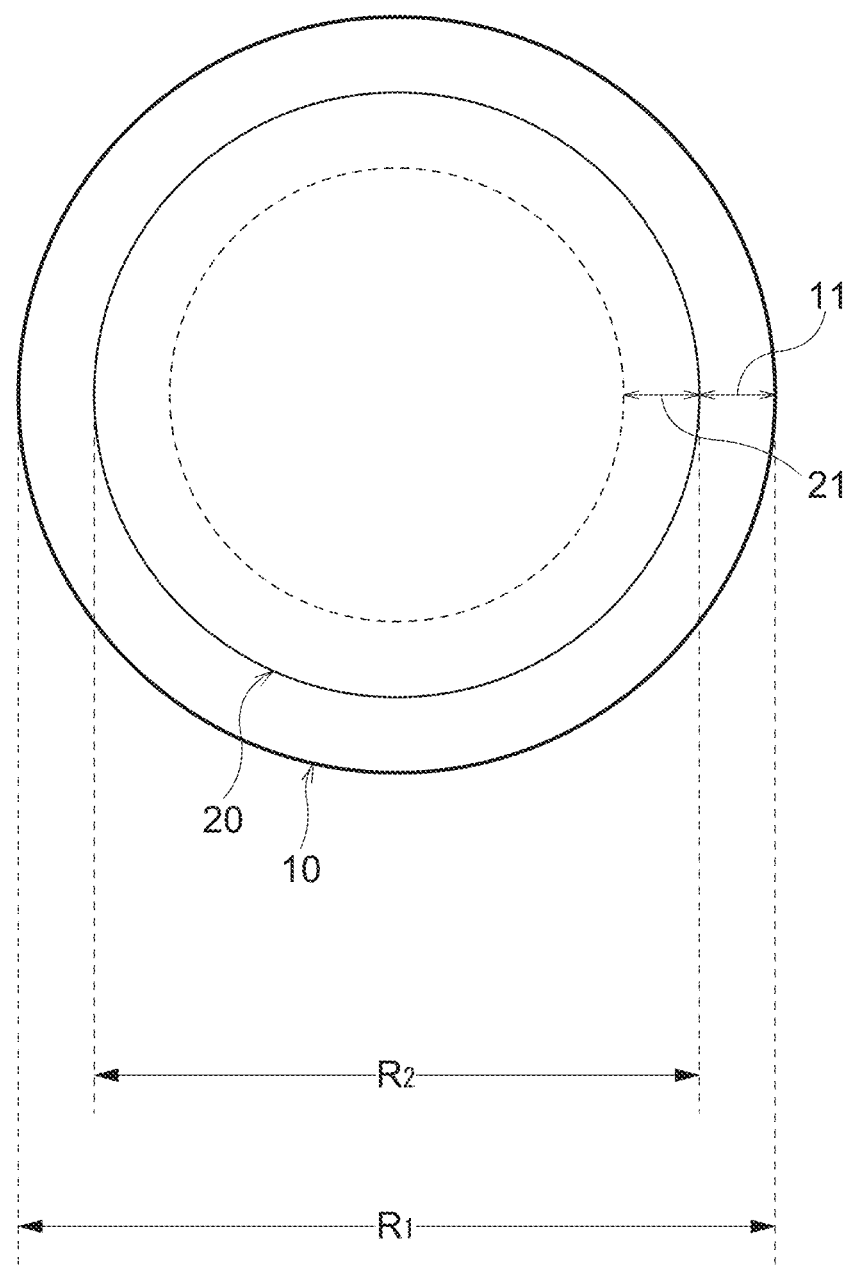
FIG. 2 is a plan view for explaining the cross-sectional shape (diameter) of the silicon single crystal in comparison with that of a silicon wafer.

FIG. 2 is a plan view for explaining the cross-sectional shape (diameter) of the silicon single crystal in comparison with that of a silicon wafer.

As illustrated in FIG. 2, in the growing process of the silicon single crystal by the CZ method, a silicon single crystal 10 having a diameter $R_1$ which is 1.02 to 1.07 times larger than a specified diameter $R_2$ (e.g., 300 mm) of a silicon wafer 20 is pulled up. At this time, a pull-up condition is controlled such that an oxygen concentration in the silicon single crystal 10 is $8 \times 10^{17}$ atoms/cm$^3$ or more and $14 \times 10^{17}$ atoms/cm$^3$ or less and that the R-OSF region is positioned in an outer peripheral grinding region 11 which is positioned outside the specified diameter $R_2$. An outer peripheral region 21 of the silicon wafer 20 is a region that is supported by a vertical boat when the wafer is subjected to heat treatment in a vertical furnace and a region between the outermost periphery and the dashed line in FIG. 2 positioned inward therefrom by 10 mm.

When the silicon single crystal 10 is grown by the CZ method, the type and distribution of the defect contained in the single crystal depend upon a ratio V/G between a single crystal pull-up speed V and a temperature gradient G in a single crystal growing direction.

Figure 3:
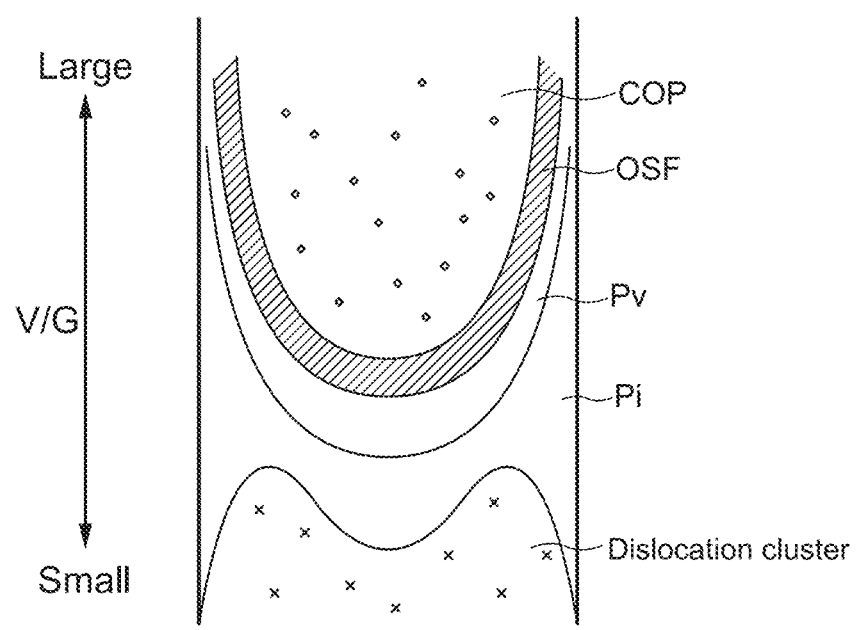
FIG. 3 is a view illustrating the general relationship between the V/G and type and distribution of the defect.

FIG. 3 is a view illustrating the general relationship between the V/G and type and distribution of the defect.

As illustrated in FIG. 3, when the V/G is large, vacancies are excessively generated, a minute void (defect generally called "COP (Crystal Originated Particle)") which is an aggregate of vacancies occurs. On the other hand, when the V/G is small, interstitial silicon atoms are excessively generated, and thus a dislocation cluster which is an aggregate of interstitial silicon is generated. Between the region where COP is generated and the region where the dislocation cluster is generated, three regions: an OSF region; a Pv region; and a Pi region exist (which are in the descending order of the V/G value). The OSF region is a region where an OSF (Oxidation induced Stacking Fault) is generated when a silicon single crystal wafer is subjected to oxidation heat treatment at a high temperature (generally, 1000° C. to 1200° C.). The Pv region includes oxygen-precipitation nuclei in an as-grown state, and when the wafer is subjected to heat treatment including two stages at low and high temperatures (e.g., 800° C. and 1000° C.), oxygen precipitates are easily generated. The Pi region substantially does not include oxygen-precipitation nuclei in the as-grown state, and is a region where oxygen precipitates are not easily generated even after heat treatment.

Normally, when the V/G is large, the OSF is generated in a ring shape around the center axis of a silicon single crystal, so that it is also called "R-OSF region". The range of the V/G where the R-OSF region appears is very narrow, so that it is necessary to strictly manage the pull-up speed V in the manufacturing process of the silicon single crystal 10 containing the R-OSF region. That is, control needs to be performed so that the V/G falls within an adequate range in both the diameter direction and length direction of the crystal. For the diameter direction of the single crystal, the pull-up speed V is constant at any position in the diameter direction, so that the structure of a hot zone in a CZ furnace should be designed so that the temperature gradient G falls within a predetermined range. For the length direction, the temperature gradient G depends upon a pull-up distance, so that the V should be changed in the crystal length direction in order to keep the V/G within a predetermined range.

Then, a pull-up speed profile is set so that the R-OSF region is contained in the silicon single crystal, and Cu (copper) decoration and heat treatment for OSF evaluation are applied to a wafer sample cut out from the pulled-up silicon single crystal to evaluate the width or position of the OSF region. Then, based on the width or position, subsequent pull-up speed profile is adjusted. That is, a wider R-OSF region means an excessively large V/G (V is excessively large), so that the V is set relatively low as the subsequent pull-up profile; conversely, a narrower R-OSF region means an excessively small V/G (V is excessively small), so that the V is set relatively high as the subsequent pull-up profile.

As described above, by adjusting the subsequent pull-up speed profile using the width or position of the R-OSF region as an index, the silicon single crystal 10 containing the R-OSF region in the outer peripheral grinding region 11 can be stably pulled up. Crystal heat hysteresis at this time is preferably as follows: a temperature range of 1080° C. to 1150° C. for 40 minutes or less; a temperature range of 980° C. to 1020° C. for 30 minutes or less; and a temperature range of 650° C. to 750° C. for 150 minutes or less.

The silicon single crystal 10 is doped with nitrogen of $1 \times 10^{12}$ atoms/cm$^3$ or more and $1 \times 10^{13}$ atoms/cm$^3$ or less. The doping of nitrogen can increase the BMD density in the wafer surface, thereby enhancing the gettering capability of the epitaxial silicon wafer.

The nitrogen doping amount is preferably $1 \times 10^{13}$ atoms/cm$^3$ or less. By increasing the doping amount, the BMD density on the entire wafer surface can be increased, and thus required gettering capability can be easily ensured; on the other hand, however, the BMD density is further increased in the wafer outer peripheral region 21 illustrated in FIG. 2, while a residual oxygen concentration in the wafer is reduced to decrease wafer strength, with the result that slip dislocation easily occurs. Further, the more the nitrogen doping amount is, the wider the width of the R-OSF region, which makes it difficult to control the pull-up condition such that the R-OSF region is not contained in the silicon wafer.

Figure 4A:
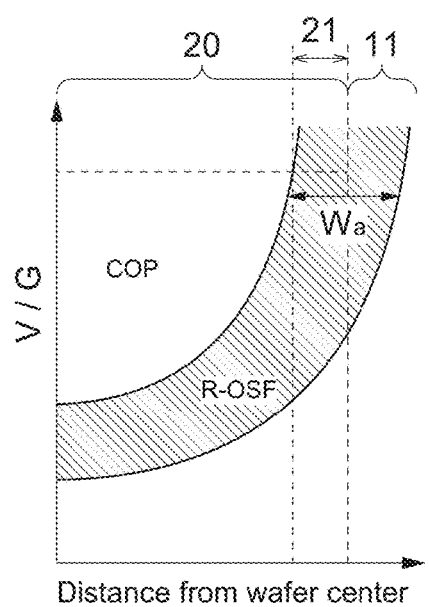
FIGS. 4A and 4B are graphs each illustrating the relationship between the nitrogen doping amount and the R-OSF region.
Figure 4B:
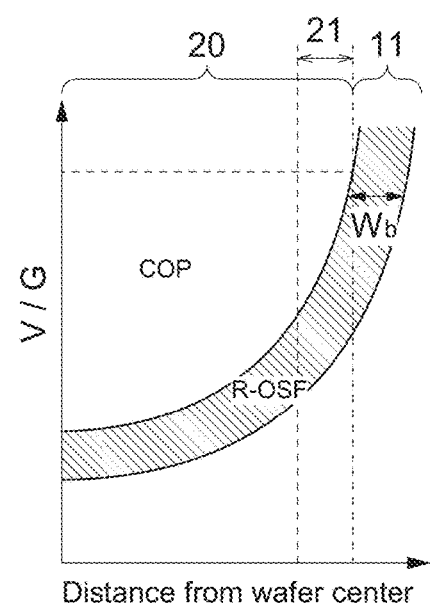

FIGS. 4A and 4B are graphs each illustrating the relationship between the nitrogen doping amount and the R-OSF region. The graph of FIG. 4A illustrates the R-OSF region when the nitrogen doping amount is large, and the graph of FIG. 4B illustrates the R-OSF region when the nitrogen doping amount is small. The horizontal axis of each of the graphs of FIGS. 4A and 4B represents a distance from the center of the silicon single crystal, and the vertical axis thereof represents the V/G.

As illustrated in FIGS. 4A and 4B, a width Wa of the R-OSF region when the nitrogen doping amount is large is wider than a width Wb of the R-OSF region when the nitrogen doping amount is small. Thus, when the nitrogen doping amount is large, it is difficult to position the R-OSF region outside the silicon wafer 20. The R-OSF region is a region containing the nuclei of the OSF even in an as-grown state, that is, a region containing plate-like oxygen precipitates, so that when the wafer outer peripheral region 21 contains the R-OSF region, the BMD density of the wafer outer peripheral region 21 is increased, while the residual oxygen concentration is reduced, with the result that the strength of the wafer outer peripheral region 21 is reduced.

Thus, in the present embodiment, in order to position the R-OSF region within the outer peripheral grinding region 11 outside the silicon wafer 20, the nitrogen doping amount is reduced as much as possible to reduce the BMD density of the wafer outer peripheral region 21 to a low value, and the width of the R-OSF region is narrowed as much as possible. Further, as described later, by positioning a part of the R-OSF region near the outer peripheral region 21 at the boundary portion thereof, the BMD density of the outer peripheral region 21 can be reduced, so that it is possible to enhance the strength of the outer peripheral region 21 to thereby suppressing occurrence of the slip dislocation.

Subsequently, the silicon single crystal is processed to obtain a silicon wafer (polished wafer) (step S12 of FIG. 1). The silicon wafer is obtained by cutting a silicon single crystal ingot into blocks of the same size, followed by rounding processing (outer periphery grinding) for making the diameters of all the blocks equal to each other, then by a slice process, a beveling process, a wrapping process, an etching process, a polishing process, a cleaning process, and the like. In the rounding processing, the outer peripheral grinding region 11 outside the target diameter $R_2$ of the wafer is removed, whereby the R-OSF region is removed. The entire surface of the thus processed silicon wafer consists of a COP region.

The COP region means a region where the COP is detected by observation/evaluation to be described below. First, SC-1 cleaning (cleaning using a liquid mixture obtained by mixing ammonia water, hydrogen peroxide water, and ultrapure water in a ratio of 1:1:15) is applied to the silicon wafer. Then, the surface of the silicon wafer after the cleaning is observed/evaluated using a surface defect inspection apparatus (e.g., KLA-Tencor: Surfscan SP-2) to specify a LPD (Light Point Defect) estimated as surface pits. At this time, an observation is set to an Oblique mode (oblique incidence mode), and estimation of the surface pits is made based on a detection size ratio between wide and narrow channels. Then, whether the thus specified LPD is the COP is evaluated using an AFM (Atomic Force Microscope). Through this observation/evaluation, a region having the COP is defined as the COP region.

Whether the entire surface of the obtained silicon wafer is the COP region can be confirmed by applying heat treatment for evaluation (heat treatment for evaluation of oxidation-induced stacking fault) to a wafer sample (step S13 of FIG. 1). The evaluation heat treatment is treatment that makes the OSF apparent. Specifically, as the evaluation heat treatment, oxidation heat treatment is applied to the wafer sample in a wet oxygen atmosphere at 1140° C. for two hours. Then, the surface of the wafer is etched by 2 μm using a Wright etching liquid. After that, the OSF density is counted by measuring etch pits observed on the wafer surface using an optical microscope. The temperature of the oxidation heat treatment may be 1000° C. to 1200° C., and heat treatment time may be 1 hour to 16 hours. When the observed OSF density of the silicon wafer is 100/cm$^2$ or less, it can be said that the entire surface of the silicon wafer consists of the COP region. In this case, it is possible to suppress occurrence of an epitaxial defect.

Subsequently, annealing treatment (pre-annealing) for growing BMD nuclei is performed (step S14 of FIG. 1). The pre-annealing is heat treatment performed at 900° C. or lower for 10 minutes to 60 minutes. When the nitrogen doping amount in the silicon wafer is reduced as described above, the BMD density on the entire wafer surface is reduced, thus failing to obtain a desired BMD density (e.g., 1×10$^8$/cm$^3$ or more) at a center region of the wafer. In particular, when an epitaxial process is performed without performing the pre-annealing, minute oxygen-precipitation nuclei are eliminated during the epitaxial process, thus failing to obtain a desired BMD density. However, when the pre-annealing is performed before the epitaxial process, it is possible to ensure a desired BMD density even when the nitrogen doping amount is small.

Further, in the present embodiment, the BMD density in the wafer outer peripheral region 21 can be reduced by positioning the R-OSF region within the outer peripheral grinding region 11.

Figure 5:
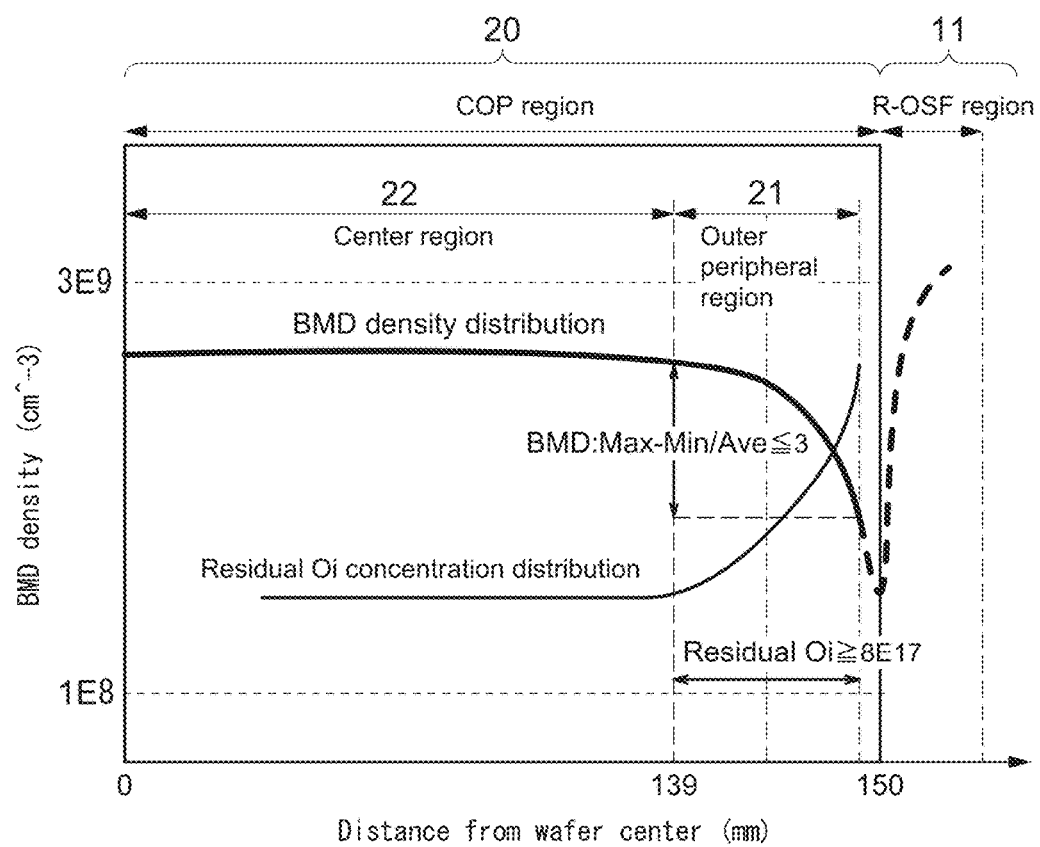
FIG. 5 is a graph illustrating a BMD density distribution in the wafer radial direction, in which the horizontal axis represents a distance (mm) from the wafer center, and the vertical axis represents a BMD density (/cm³)

FIG. 5 is a graph illustrating a BMD density distribution in the wafer radial direction, in which the horizontal axis represents a distance (mm) from the wafer center, and the vertical axis represents a BMD density (/cm$^3$). The diameter of the silicon wafer is 300 mm, and an outermost periphery of the silicon wafer is positioned at a distance of 150 mm from the wafer center. Thus, the position at a distance of 1 mm from the outermost periphery is separated from the wafer center by 149 mm, and the position at a distance of 10 mm from the outermost periphery is separated from the wafer center by 140 mm. The outer peripheral region 21 of the silicon wafer 20 is defined as a 1-10 mm range separated inward from the outermost periphery. The region outside the outermost periphery of the silicon wafer 20 is defined as the outer peripheral grinding region 11 of the silicon single crystal.

As illustrated in FIG. 5, the entire surface of the silicon wafer 20 consists of the COP region, and the R-OSF region is positioned within the outer peripheral grinding region 11. The BMD density in the wafer radial direction is substantially constant in a center region 22. However, it is once reduced in the wafer outer peripheral region 21 in the vicinity of the boundary with the R-OSF region, and is then increased in the R-OSF region.

With attention paid to such a phenomenon that the BMD density is reduced, the present embodiment aims at reducing the BMD density in the wafer outer peripheral region 21 by positioning the R-OSF region within the outer peripheral grinding region 11 of the silicon single crystal and positioning the region in the vicinity of the boundary between the R-OSF region and the COP region where the BMD density is reduced within the wafer outer peripheral region 21.

Subsequently, an epitaxial process for forming a silicon epitaxial film on the surface of the silicon wafer is performed (step S15 of FIG. 1). Although not especially limited, the epitaxial process is preferably performed using a single wafer type vapor phase growing apparatus for a silicon wafer having a large diameter of 300 mm or more. The silicon wafer is set in a chamber of the vapor phase growing apparatus, and a raw-material gas such as trichlorosilane (SiHCl$_3$) is introduced into the chamber together with a carrier gas such as H$_2$ gas and a dopant gas. Then, silicon generated through thermal decomposition or reduction of the raw-material gas is grown at a reaction speed of 0.5 μm to 6.0 μm per minute on the silicon wafer heated to a high temperature of 1000° C. to 1200° C. Thereafter, the silicon wafer is cleaned, whereby an epitaxial silicon wafer is completed.

The BMD density distribution of the thus produced epitaxial silicon wafer can be confirmed by performing heat treatment for evaluation (heat treatment for evaluation of oxygen precipitates) simulating the device process to grow the BMD nuclei (step S16). The BMD density is defined as follows. The heat treatment for evaluation of oxygen precipitates is applied to the epitaxial silicon wafer at 900° C. to 1100° C. for 16 hours in an oxygen gas atmosphere. Then, the epitaxial silicon wafer is cleaved in the thickness direction thereof, and selecting etching is performed to etch the cleaved cross section thereof by a depth of 2 μm using a Wright etching liquid. Thereafter, the cleaved cross section in the thickness direction center of the silicon wafer is observed using an optical microscope, and an etch pit density in a 100 μm×100 μm square area is defined as the BMD density. The epitaxial silicon wafer according to the present embodiment has the following features in terms of the BMD density.

First, the BMD density on the entire wafer surface is $1\times10^8/cm^3$ or more. This makes it possible to enhance the gettering capability of the epitaxial silicon wafer. Preferably, the BMD density on the entire wafer surface is $3\times10^9/cm^3$ or less. When the BMD density of the wafer is excessively high, the residual oxygen concentration in the wafer is reduced to decrease wafer strength, with the result that slip dislocation easily occurs especially in the wafer outer peripheral region 21.

The BMD density in the wafer outer peripheral region 21 which is the 1 mm to 10 mm range separated inward from the outermost periphery (outermost peripheral edge) of the wafer is lower than the BMD density in the center region inside the wafer outer peripheral region 21. With this configuration, the residual oxygen concentration in the wafer outer peripheral region 21 can be increased to thereby suppress occurrence of the slip dislocation.

Further, the BMD density in the wafer outer peripheral region 21 which is the 1-10 mm range separated inward from the outermost periphery is gradually reduced toward the wafer outermost periphery, and a value ((Max−Min/Ave): variation in the BMD density) obtained by dividing a difference between the maximum value (Max) and the minimum value (Min) of the BMD density in the wafer outer peripheral region 21 by an average value (Ave) of the BMD density in the wafer outer peripheral region 21 is 3 or less. Further, the maximum value of the BMD density exists in a 6-10 mm range separated inward from the wafer outermost periphery, and the minimum value of the BMD density exists in a 0-less than 6 mm range separated inward from the wafer outermost periphery. Such a reduction in the BMD density in the wafer outer peripheral region 21 can increase the residual oxygen concentration to thereby enhance the strength of the wafer outer peripheral region 21. The reason that the wafer outer peripheral region 21 is separated inward from the outermost periphery by 1 mm or more is not only that the wafer edge is chamfered, but also that it is impossible to measure the BMD density at the outermost periphery (0 mm position from the outermost periphery).

The residual oxygen concentration in the wafer outer peripheral region 21 is $8\times10^{17}$ atoms/cm$^3$ or more. With this configuration, it is possible to suppress occurrence of the slip dislocation. The residual oxygen concentration in the wafer is higher in a region where the BMD density is lower and lower in a region where the BMD density is higher. This is considered because oxygen in the wafer is consumed for BMD formation, and the residual oxygen is reduced as the oxygen precipitates increase. In the present invention, the BMD density in the wafer outer peripheral region 21 is low, so that the residual oxygen concentration in the wafer outer peripheral region 21 can be increased to thereby enhance the wafer strength in the wafer outer peripheral region 21.

As described above, in the epitaxial silicon wafer according to the present embodiment, the BMD density in the wafer outer peripheral region 21 is low, so that the strength of the wafer outer peripheral region 21 can be enhanced to thereby suppress occurrence of the slip dislocation. Thus, during heat treatment of the wafer in a vertical furnace, it is possible to prevent occurrence of a minute flaw at a support position for the wafer housed in a vertical boat, which thereby prevents the slip dislocation from occurring with the flaw as a starting point and spreading.

While the preferred embodiment of the present invention has been described, the present invention is not limited to the above embodiment, but various modifications may be made without departing from the scope of the invention, and such modifications may be included within the scope of the present invention.

For example, although the wafer has a diameter of 300 mm in the above embodiment, the wafer diameter only needs to be 300 mm or more and, for example, may be 450 mm.

EXAMPLES

First, the characteristics of the epitaxial silicon wafers were evaluated with nitrogen concentration, oxygen concentration, and presence/absence of pre-annealing as parameters.

In this characteristic evaluation, a nitrogen-doped silicon single crystal having a diameter of 310 mm was grown by the CZ method, followed by outer periphery grinding to reduce the diameter of the silicon single crystal to 300 mm to show a round shape, and then by wafer processing. Then, before epitaxial process, heat treatment was applied, as pre-annealing, to some wafer samples at 890° C. for 20 minutes. In the epitaxial process, an epitaxial silicon film of 4 μm thickness was formed at 1100° C.

In BMD density measurement, after heat treatment for evaluation was performed at 1000° C. for 16 hours in an oxygen gas atmosphere, the epitaxial silicon wafer was cleaved in the thickness direction thereof, and then selecting etching was performed to etch the cleaved cross section thereof by a depth of 2 μm using a Wright etching liquid. Thereafter, the cleaved cross section in the thickness direction center of the silicon wafer was observed using an optical microscope to measure the BMD density. The BMD density was measured at a 10 mm pitch radially from the wafer center. In particular, in the wafer outer peripheral region (1-10 mm range separated inward from the outermost periphery), the measurement was performed at a 1 mm pitch.

The residual oxygen concentration in the epitaxial silicon wafer was measured at a 1 mm pitch in the radial direction from the wafer center, and the average value was calculated.

In slip-resistance test, additional heat treatment was performed for evaluation of thermal stress loading in a boat-shaped vertical furnace supporting the outer peripheral region of the wafer. Conditions of the evaluation heat treatment were: feeding temperature of 700° C.; temperature rising rate of 8° C./min; holding temperature and holding time of 1100° C. and 30 minutes, respectively; temperature falling rate of 3° C./min; and take-out temperature of 700° C. Then, a wafer after the heat treatment was observed by X-ray topography. Evaluation was made in terms of the length of the slip dislocation: "o", 2 mm or less; "Δ", 2 mm to 5 mm; and "x", exceeding 5 mm.

In gettering capability evaluation, Ni was applied onto the surface of the epitaxial silicon wafer after evaluation heat treatment by $1\times10^{12}$ atoms/cm$^2$, followed by heat treatment at 900° C. for 30 minutes, and then, the wafer surface was Wright-etched by 2 μm. Then, the Wright-etched wafer surface was observed through an optical microscope. Evaluation was made in terms of the present/absence of Ni silicide pits: "o", absence; and "x", presence.

The results of the above evaluation test are shown in FIG. 7. Examples 1 to 6 are produced according to the technique of the present invention, and comparative Examples 1 to 5 are produced according to the conventional technique.

As is clear from. FIG. 7, Examples 1 to 6 meeting the conditions of the present invention can make both slip resistance and gettering capability compatible.

On the other hand, Comparative Example 1 has a low nitrogen concentration and has not been subjected to pre-annealing, resulting in low BMD density and poor gettering capability.

Comparative Example 2 has not been subjected to pre-annealing, but it shows a high nitrogen concentration of $5 \times 10^{13}$ atoms/cm$^3$, so that the BMD density exhibiting sufficient gettering capability is obtained, while the minimum residual oxygen concentration in the wafer outer peripheral region is as low as $7.8 \times 10^{17}$ atoms/cm$^3$. Further, a variation ((Max/Min)/Ave) in the BMD density in the wafer outer peripheral region is as large as 3.8, resulting in an increase in slip dislocation length. This is considered because the excessively large variation in BMD density in the wafer outer peripheral region changes heat transfer at the wafer support position, causing increase in thermal stress.

Comparative Example 3 is similar to Comparative Example 2, but the residual oxygen concentration thereof in the wafer outer peripheral region is $7.5 \times 10^{17}$ atoms/cm$^3$, which is as low as lower than $8 \times 10^{17}$ atoms/cm$^3$, and a variation ((Max/Min)/Ave) in the BMD density is as large as 5.7, resulting in a further increase in the slip dislocation length.

Comparative Examples 4 and 5 show results obtained when using a wafer having a nitrogen concentration higher than $1 \times 10^{13}$ atoms/cm$^3$ and applying pre-annealing to the wafer. The BMD density exceeding $3 \times 10^9$/cm$^3$ is observed in the wafer. Excessive BMD formation is undesirable since it induces an epitaxial defect due to the BMD. In addition, the BMD density in the water outer peripheral region is high, and residual oxygen concentration in the wafer outer peripheral region is low, resulting in poor slip resistance.

Figure 6:
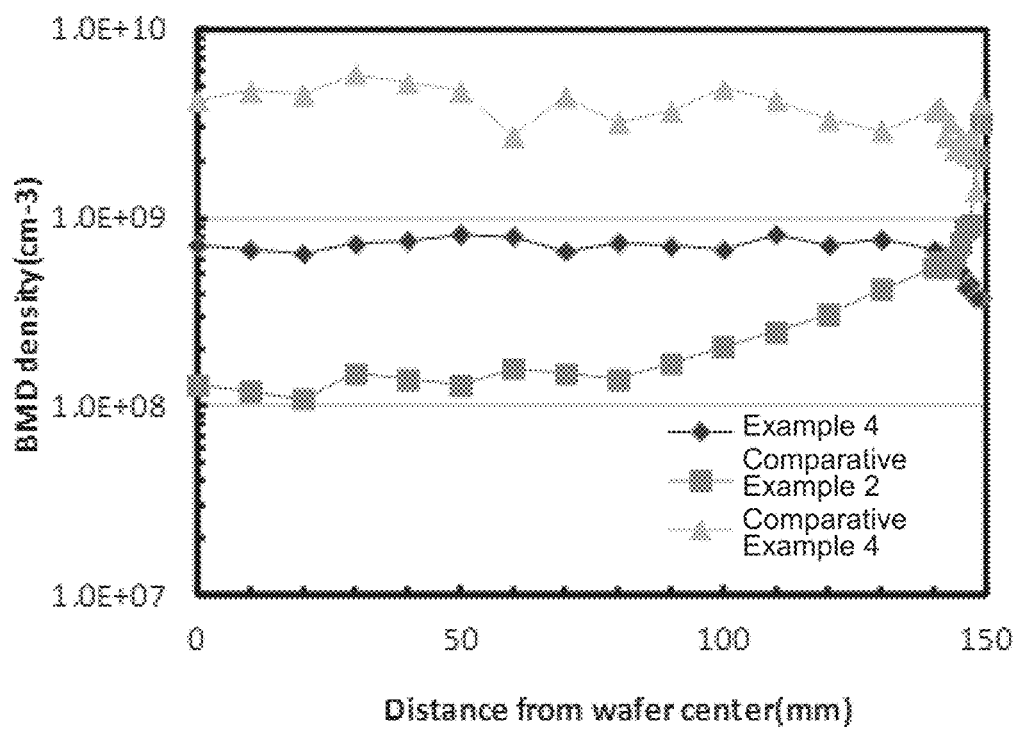
FIG. 6 is a graph illustrating BMD density distributions in the wafer radial direction of Example 4, Comparative Example 2, and Comparative Example 4, in which the horizontal axis represents a distance (mm) from the wafer center, and the vertical axis represents a BMD density (/cm³)

FIG. 6 is a graph illustrating BMD density distributions in the wafer radial direction of Example 4, Comparative Example 2, and Comparative Example 4, in which the horizontal axis represents a distance (mm) from the wafer center, and the vertical axis represents a BMD density (/cm$^3$). FIG. 8 shows a BMD density distribution in the wafer outer peripheral region.

As illustrated in FIG. 6, the BMD densities of Example 4 and Comparative Example 4 are gradually reduced in the wafer outer peripheral region. The Comparative Example 4 has a high BMD density of $1 \times 10^9$/cm$^3$ and thus exhibits sufficient gettering capability; however, it has a residual oxygen concentration of $8 \times 10^{17}$ atoms/cm$^3$ in the wafer outer peripheral region, resulting in an increase in the slip dislocation length and poor slip resistance.

In Comparative Example 2, the BMD density is increased toward the wafer outer periphery, and the BMD density in the outer peripheral region is as high as $1 \times 10^1$/cm$^3$ or more. Thus, the residual oxygen concentration is reduced due to high BMD density, resulting in poor slip resistance.

The above results show that the BMD density is desirably $1 \times 10^8$/cm$^3$ or more (and $1 \times 10^9$/cm$^3$ or less) in the wafer surface and has a surface distribution in which it is gradually reduced in the wafer outer peripheral region.

FIG. 8 shows results obtained when investigating in detail the BMD density distributions of the wafers of Example 4 and Comparative Examples 2 and 4 at a 1 mm pitch in the radial direction. As is clear from FIG. 8, when the maximum value of the BMD density exists in a 140-144 mm (6-10 mm range separated inward from the outermost periphery) range separated outward from the wafer center, and the minimum value of the BMD density exists in a range exceeding 144 mm (0-less than 6 mm range separated inward from the outermost periphery) separated outward from the wafer center, the slip resistance becomes satisfactory.

Secondly, the characteristics of the epitaxial silicon wafers produced using a plurality of silicon single crystals having different nitrogen concentrations and diameters were evaluated.

In this characteristic evaluation, a plurality of silicon single crystals having different nitrogen concentrations were grown by the CZ method, followed by outer periphery grinding to reduce the diameter of each silicon single crystal to 300 mm, and then by wafer processing. In the growing process of the silicon single crystal, a portion having a wide outer periphery grinding region and a portion having a narrow outer periphery grinding region were made to be included in one silicon single crystal ingot by changing the crystal diameter.

Then, the maximum value of the OSF density of the processed wafer (polished wafer) was measured. In the OSF density measurement, heat treatment for evaluation was performed at 1140° C. for two hours, followed by 2 μm Wright etching. After that, the OSF density on the wafer surface was measured using an optical microscope.

Then, before epitaxial process, heat treatment was applied, as pre-annealing, to the silicon wafer at 890° C. for 20 minutes. In the epitaxial process, an epitaxial silicon film of 4 μm thickness was formed at 1100° C.

In BMD density measurement, after heat treatment for evaluation was performed at 1000° C. for 16 hours in an oxygen gas atmosphere, the epitaxial silicon wafer was cleaved in the thickness direction thereof, and then selecting etching was performed to etch the cleaved cross section thereof by a depth of 2 μm using a Wright etching liquid. Thereafter, the cleaved cross section in the thickness direction center of the silicon wafer was observed using an optical microscope to measure the BMD density. The BMD density was measured at a 10 mm pitch radially from the wafer center. In particular, in the wafer outer peripheral region (1-10 mm range separated inward from the outermost periphery), the measurement was performed at a 1 mm pitch.

In slip-resistance test, additional heat treatment was performed for evaluation of thermal stress loading in a boat-shaped vertical furnace supporting the outer peripheral region of the wafer. Conditions of the evaluation heat treatment were: feeding temperature of 700° C.; temperature rising rate of 8° C./min; holding temperature and holding time of 1100° C. and 30 minutes, respectively; temperature falling rate of 3° C./min; and take-out temperature of 700° C. Then, a wafer after the heat treatment was observed by X-ray topography. Evaluation was made in terms of the length of the slip dislocation: "o", 2 mm or less; "Δ", 2 mm to 5 mm; and "x": exceeding 5 mm.

The results of the above evaluation test are shown in FIG. 9. Examples 1 to 9 are produced according to the technique of the present invention, and Comparative Examples 1 to 9 are produced according to the conventional technique. The wafers (e.g., Examples 1, 4, and 7 and Comparative Example 1) having the same nitrogen concentration are those cut out from the same silicon single crystal ingot.

As is clear from FIG. 9, in Examples 1 to 9 meeting the conditions of the present invention, the nitrogen concentration is as low as $1.0 \times 10^{12}$ to $1.0 \times 10^{13}$ atoms/cm$^3$, and the ratio of the silicon single crystal diameter to the wafer diameter is 1.02 to 1.07. The OSF density of these wafers is 100/cm² or less, and the wafer entire surface consists of the COP region crystal. Further, a variation ((Max/Min)/Ave) in the BMD density in the outer peripheral region of the epitaxial silicon wafer is 3 or less, resulting in satisfactory slip resistance.

On the other hand, in the Comparative Examples 1 to 3, the diameter ratio of the silicon single crystal is as low as 1.01, and the maximum value of the OSF density is as large as 109 to 163/cm². Thus, it can be understood that the R-OSF region exists not only in the outer periphery grinding region of the silicon single crystal, but also inside the silicon wafer, with the result that an epitaxial defect is induced to degrade epitaxial quality.

In Comparative Examples 4 to 6, the nitrogen concentration is as high as $1.9 \times 10^{13}$ to $9.5 \times 10^{13}$ atoms/cm³, so that the width of the OSF ring is increased. Thus, even when a silicon single crystal having the diameter ratio of 1.05 is subjected to rounding processing, the R-OSF region cannot be removed, resulting in very high OSF density, which in turn induces an epitaxial defect. Further, the BMD density in the wafer outer peripheral region is high, and its variation is 3 or more, resulting in poor slip resistance.

In Comparative Examples 7 to 9 as well, the nitrogen concentration is as high as $1.9 \times 10^{13}$ to $9.5 \times 10^{13}$ atoms/cm³, while the diameter ratio of the silicon single crystal is as large as 1.08, so that the R-OSF region can be removed by rounding processing. However, the BMD density in the wafer outer peripheral region is high, and the residual oxygen concentration in the wafer outer peripheral region is low, resulting in poor slip resistance. Further, the diameter of the silicon single crystal needs to be 324 mm. Accordingly, more silicon raw material is required for wafer manufacturing, resulting in poor productivity and thus in low suitability for mass production.

What is claimed is:

1. An epitaxial silicon wafer comprising:
   a silicon wafer consisting of a crystal oriented particle region in which a nitrogen concentration is from $1 \times 10^{12}$ atoms/cm³ to $1 \times 10^{13}$ atoms/cm³; and
   an epitaxial silicon film formed on a surface of the silicon wafer, wherein
   when treatment for evaluating oxygen precipitates is applied to the epitaxial silicon wafer, a density of oxygen precipitates formed inside the silicon wafer is from $1 \times 10^8$ atoms/cm³ to $3 \times 10^9$ atoms/cm³ over the entire radial direction of the silicon wafer,
   an average density of the oxygen precipitates formed in an outer peripheral region of the silicon wafer within 1-10 mm separated inward from an outermost periphery thereof is lower than an average density of the oxygen precipitates formed in a center region of the silicon wafer which is the region of the silicon wafer other than the outer peripheral region,
   a value obtained by dividing a difference between a maximum value and a minimum value of the density of the oxygen precipitates in the outer peripheral region by an average value of the density of the oxygen precipitates in the outer peripheral region is 3 or less, and
   a residual oxygen concentration in the outer peripheral region is $8 \times 10^{17}$ atoms/cm³ or more as measured by Old-ASTM_F121, 1979.

2. The epitaxial silicon wafer as claimed in claim 1, wherein
   the maximum value of the density of the oxygen precipitates exists in a region separated inward from the outermost periphery from 6 mm to 10 mm, and
   the minimum value of the density of the oxygen precipitates exists in a region separated inward from the outermost periphery from 0 to less than 6 mm.

3. The epitaxial silicon wafer as claimed in claim 2, wherein
   the density of the oxygen precipitates in the outer peripheral region is gradually reduced toward the outermost periphery of the silicon wafer.

4. The epitaxial silicon wafer as claimed in claim 1, wherein
   when heat treatment for evaluating oxidation-induced stacking fault is applied, the density of oxidation-induced stacking fault observed on the back surface of the epitaxial silicon wafer is 100/cm² or less.

5. The epitaxial silicon wafer as claimed in claim 1, wherein
   the silicon wafer is cut out from a silicon single crystal ingot whose oxygen concentration is adjusted in a range of from $8 \times 10^{17}$ atoms/cm³ to $14 \times 10^{17}$ atoms/cm³ or less, as measured by Old-ASTM_F121, 1979.

6. The epitaxial silicon wafer as claimed in claim 1, wherein
   a diameter of the epitaxial silicon wafer is 300 mm or more.

7. The epitaxial silicon wafer as claimed in claim 1, wherein the silicon wafer is cut out from a straight body section of a silicon single crystal ingot having a diameter 1.02 to 1.07 times larger than a target diameter and processed into the target diameter.

* * * * *